United States Patent [19]
Joshi et al.

[11] Patent Number: 5,650,754
[45] Date of Patent: Jul. 22, 1997

[54] PHASE-LOCKED LOOP CIRCUITS AND VOLTAGE CONTROLLED OSCILLATOR CIRCUITS

[75] Inventors: Shankar R. Joshi, Elmont, N.Y.; Ulrich L. Rohde, Upper Saddle River, N.J.; Klaus Eichel, Weissenhorn, Germany

[73] Assignee: Synergy Microwave Corporation, Paterson, N.J.

[21] Appl. No.: 389,710

[22] Filed: Feb. 15, 1995

[51] Int. Cl.⁶ .................... H03B 5/12; H03L 7/08; H03L 7/099; H03L 7/16
[52] U.S. Cl. .................... 331/36 C; 331/17; 331/25; 331/74; 331/108 D; 331/117 R; 331/175; 331/177 V; 331/186; 455/260
[58] Field of Search .................... 331/8, 15–17, 331/25, 34, 36 C, 74–88, 108 C, 108 D, 117 R, 117 FE, 117 D, 175, 177 R, 177 V, 185, 186, 9, 172; 327/155, 540, 541; 375/376; 455/260, 262

[56] References Cited

U.S. PATENT DOCUMENTS

| | | | |
|---|---|---|---|
| 2,770,733 | 11/1956 | Norton | 331/2 |
| 2,942,203 | 6/1960 | Winkler | 331/2 |
| 3,116,463 | 12/1963 | Singer | 331/9 |
| 3,227,963 | 1/1966 | Dimmick | 331/2 |
| 3,304,518 | 2/1967 | Mackey | 331/172 X |
| 3,382,463 | 5/1968 | Hurtig | 331/177 V |
| 3,675,132 | 7/1972 | Hansen et al. | 331/172 X |
| 3,789,302 | 1/1974 | Rearwin et al. | 331/76 X |
| 3,848,199 | 11/1974 | Weber | 331/2 |
| 3,902,132 | 8/1975 | Fried | 331/22 X |
| 4,122,408 | 10/1978 | Walls | 331/9 X |
| 4,128,816 | 12/1978 | Shimotsuma | 331/186 X |
| 4,253,180 | 2/1981 | Kimbrough | 331/8 |
| 4,378,534 | 3/1983 | Goedken et al. | 331/177 V X |
| 4,635,003 | 1/1987 | Fenk | 331/74 X |
| 4,720,688 | 1/1988 | Hasegawa | 331/16 X |
| 4,751,475 | 6/1988 | Kubo et al. | 331/177 V X |
| 4,754,236 | 6/1988 | Mamodaly et al. | 331/177 V X |
| 4,821,001 | 4/1989 | Hattori | 331/175 X |
| 4,859,969 | 8/1989 | Malinowski et al. | 331/76 X |
| 5,019,790 | 5/1991 | Kapetanic | 331/16 |
| 5,036,295 | 7/1991 | Kamitani | 331/36 C X |
| 5,097,228 | 3/1992 | McJunkin | 331/185 X |
| 5,101,177 | 3/1992 | Norimatsu | 331/117 R |
| 5,107,272 | 4/1992 | Joynson et al. | 331/22 X |
| 5,140,286 | 8/1992 | Black et al. | 331/186 X |
| 5,198,903 | 3/1993 | Tinaphong | 358/186 |
| 5,212,460 | 5/1993 | Tamagawa | 331/186 X |
| 5,258,726 | 11/1993 | Pham | 331/117 R |
| 5,300,898 | 4/1994 | Chen et al. | 331/57 |
| 5,311,149 | 5/1994 | Wagner et al. | 331/117 X |
| 5,331,295 | 7/1994 | Jelinek et al. | 331/57 |
| 5,440,277 | 8/1995 | Ewen et al. | 331/186 X |
| 5,459,423 | 10/1995 | Nozawa et al. | 327/541 X |

*Primary Examiner*—David Mis
*Attorney, Agent, or Firm*—David, Littenberg, Krumholz & Mentlik

[57] ABSTRACT

Voltage controlled oscillator (VCO) circuits include a VCO and voltage regulator provided on an integrated VCO module, balanced control input for the VCO, buffering of the VCO and frequency multiplication of the VCO output signal. Such improved VCO circuits are especially useful in phase-locked loop (PLL) circuits. Improved PLL circuits are also provided, including a PLL circuit with separate analog and digital grounds.

22 Claims, 3 Drawing Sheets

PHASE-LOCHED LOOP CIRCUITS AND VOLTAGE CONTROLLED OSCILLATOR CIRCUITS

FIELD OF THE INVENTION

The present invention relates to voltage controlled oscillator (VCO) circuits. Such VCO circuits are especially useful in phase-locked loop (PLL) circuits in high frequency applications such as cellular and digital telephone communications.

BACKGROUND OF THE INVENTION

The recent proliferation of wireless communications applications such as in the cellular telephone industry has led to demand for more and more channels over which to carry information to accommodate the growing number of users. Meeting this demand has been difficult, notably due to the limited portion of electromagnetic spectrum allocated to the commercial communications industry.

One solution to the problem of increasing the amount of channels in the limited commercial spectrum has been to dramatically narrow the bandwidth allocated for each channel. For example, a 10 MHz channel bandwidth allowing only 10 channels to fit within a 100 MHz range can be reduced to a channel bandwidth of 1 MHz thereby allowing 100 channels to fit within the same 100 MHz range. This "squeezing" of channel bandwidth has increased the amount of available channels but has led to other problems such as electromagnetic interference (EMI) and radio frequency interference (RFI) between adjacent channels separated by the smallest of the bandwidths.

To compensate for the increase in channels with such narrow bandwidths, the circuitry designed for handling wireless communications must be extremely precise. With increased precision, however, comes increased costs that are ultimately passed on to the consumer leading to higher prices. Because of the high precision circuitry needed, the elimination of unwanted noise and interference in such circuitry is now more critical than ever.

One of the most critical components in communications circuitry is the phase-locked loop (PLL). The PLL enables communications equipment to quickly "lock" onto a specifically selected frequency, typically the carrier frequency over which communications are sent. This fast locking ability is particularly important for devices such as cellular telephones, where the telephone must almost instantly switch carrier frequencies when traveling through different cellular zones or "cells." An essential component of a PLL is a voltage controlled oscillator (VCO), whose output voltage is controllable by the application of an input control voltage. The VCO, however, is very sensitive to fluctuations in the control voltage. Sensitivity of a VCO is typically expressed as MHz per volt. Assuming a linear frequency change versus tuning voltage characteristic for a 1,000–2,000 MHz VCO, tunable over a voltage range of 0.5 V to 10.5 V, the sensitivity will be 100 MHz/volt. This can be expressed as either 100 KHz/mV or 100 Hz/microvolt. Pick ups in the order of a few microvolts on the control line of a poorly designed VCO are not uncommon. However, any interference of the order of 1 microvolt is unacceptable in a PLL of a precision communication circuit.

Moreover, when a VCO is used in conjunction with other circuits which are capable of radiating interference signals, the control input line of the VCO should be guarded from such interference. Pushing and pulling phenomena in VCOs are well known in the industry, and improper loading of the VCO can modulate the output signal and shift the frequency. Accordingly, there is a great need to buffer the VCO output.

Because of the high degree of spectral purity required in today's communications circuits, there is a need to provide extremely precise PLL circuits. Therefore, to meet the demand of modern communications, there is a great and longfelt need to provide improved PLL and VCO circuits to solve the problems associated with the generation of stable and highly pure output frequencies.

SUMMARY OF THE INVENTION

According to the present invention, there is provided a voltage controlled oscillator circuit which includes a voltage control oscillator (VCO) having a control input for applying a control signal to the VCO, a supply input for providing a supply voltage signal to the oscillator, and an output for providing an output signal having a frequency which varies in response to the applied control signal. A voltage regulator is provided for the voltage controlled oscillator circuit in order to supply a regulated voltage to the supply input of the VCO to reduce spurious response of the output signal from the VCO. The VCO and the voltage regulator are provided on an integrated VCO module.

Another preferred embodiment of the present invention provides balanced control input to the VCO. In this embodiment, the VCO includes an oscillator circuit with two control inputs. The oscillator circuit is adapted to oscillate at a frequency which depends on a difference between voltages applied to the control inputs. An input control circuit is used for applying control inputs signals of opposite polarity to the control inputs. The input control circuit preferably includes a first input buffer circuit including a buffer amplifier and an inductor, and a second input buffer circuit including a buffer amplifier and an inductor. Preferably, the VCO and the input means are provided on an integrated VCO module.

In accordance with another embodiment of the present invention, a frequency multiplier can be used for high frequency applications to increase the output frequency of the VCO. Accordingly, a VCO circuit includes a VCO having a control input for applying a control signal to the VCO and an output for providing an output signal having an output frequency varying in response to the applied control signal. Frequency multiplication means are provided for increasing the output frequency of the output signal. Preferably, the frequency multiplication means includes a frequency multiplier having an input connected to the output of the VCO and an output for providing an output signal having a frequency which is n times the output frequency of the VCO output signal, wherein n is an integer, preferably selected from the range of 2–16. The frequency multiplier can therefore be a frequency doubler, tripler or quadrupler, etc. More preferably, the VCO and the frequency multiplication means are provided on an integrated VCO module.

In yet another preferred embodiment, a VCO buffer circuit is provided on an integrated VCO module. Thus, a VCO circuit is provided with a VCO having a control input for applying a control signal to the VCO and an output for providing an output signal having an output frequency which varies in response to the applied control signal. A buffer circuit is included and has an input connected to the output of the VCO, and first and second outputs. The buffer circuit is adapted to conduct the output signal from the VCO to the first and second output to isolate the first output from external signal supplied to the second output. The VCO and buffer circuit are provided on an integrated VCO module. The buffer circuit can comprise a number of embodiments, including a passive or active in-phase power divider, a coupler, and isolator, a hybrid, or a high frequency amplifier. Moreover, the power divider, coupler, isolator or hybrid can each be combined together with a high frequency amplifier to further increase the buffering of the VCO.

In yet another preferred embodiment, the VCO buffer circuit can be used in a phase-locked loop (PLL) circuit. Here, the PLL circuit includes a phase detector with a first input for receiving a reference signal, a second input for receiving a comparison signal, and an output for providing a control signal having a control frequency to the VCO. The PLL circuit includes a VCO having a control input connected to the output of the phase detector for applying the control signal to the VCO and an output for providing an output signal having an output frequency which varies in response to the applied control signal. A buffer circuit is provided for the VCO circuit and includes an input connected to the output of the VCO, and first and second outputs. The buffer circuit is adapted to conduct the output from the VCO to the first and second outputs and to isolate the first output from external signals supplied to the second output. The buffer circuit and the VCO are provided on an integrated VCO module. The PLL further includes a digital interface circuit having an input connected to the second output of the buffer circuit and an output connected to the second input of the phase detector for providing an output signal with a comparison frequency to the phase detector for comparison with the reference signal to generate the control signal. The buffer circuit can include an active or passive power divider, an coupler, an isolator, a hybrid, or an amplifier. In addition, the amplifier can be combined with the power divider, coupler, isolator or hybrid to further increase buffering. Preferably, the digital interface circuit includes a divide-by-m programmable divider, a digital controller, a prescaler, and the phase detector.

In still another preferred embodiment, a PLL circuit is provided with separate digital and analog grounds. Here, a PLL circuit includes a phase detector, a VCO, and a digital interface circuit. The phase detector includes both an analog and digital ground, the VCO includes an analog ground and a digital interface circuit includes both an analog and digital ground. Grounding means are provided to connect each of the analog grounds of the PLL circuit to a common analog ground, and to connect each of the digital grounds of the PLL circuit to a common digital ground which is separate from the common analog ground. Preferably, a buffer circuit is also provided, as previously described, having an analog ground connected to the common analog ground of the grounding means. In addition, a low pass filter circuit can also be provided having an analog ground connected to the common analog ground.

All of the above improvements in the PLL and VCO circuits can be combined in a single PLL circuit which is ideal for generating stable and highly pure output frequencies through minimization of interference and noise.

The objects, features and advantages of the present invention will be more readily apparent from the detailed description of the preferred embodiments set forth below, taking in conjuction with the accompanying drawings.

DETAILED DESCRIPTION OF PREFERRED EMBODIMENTS

Figure 1:
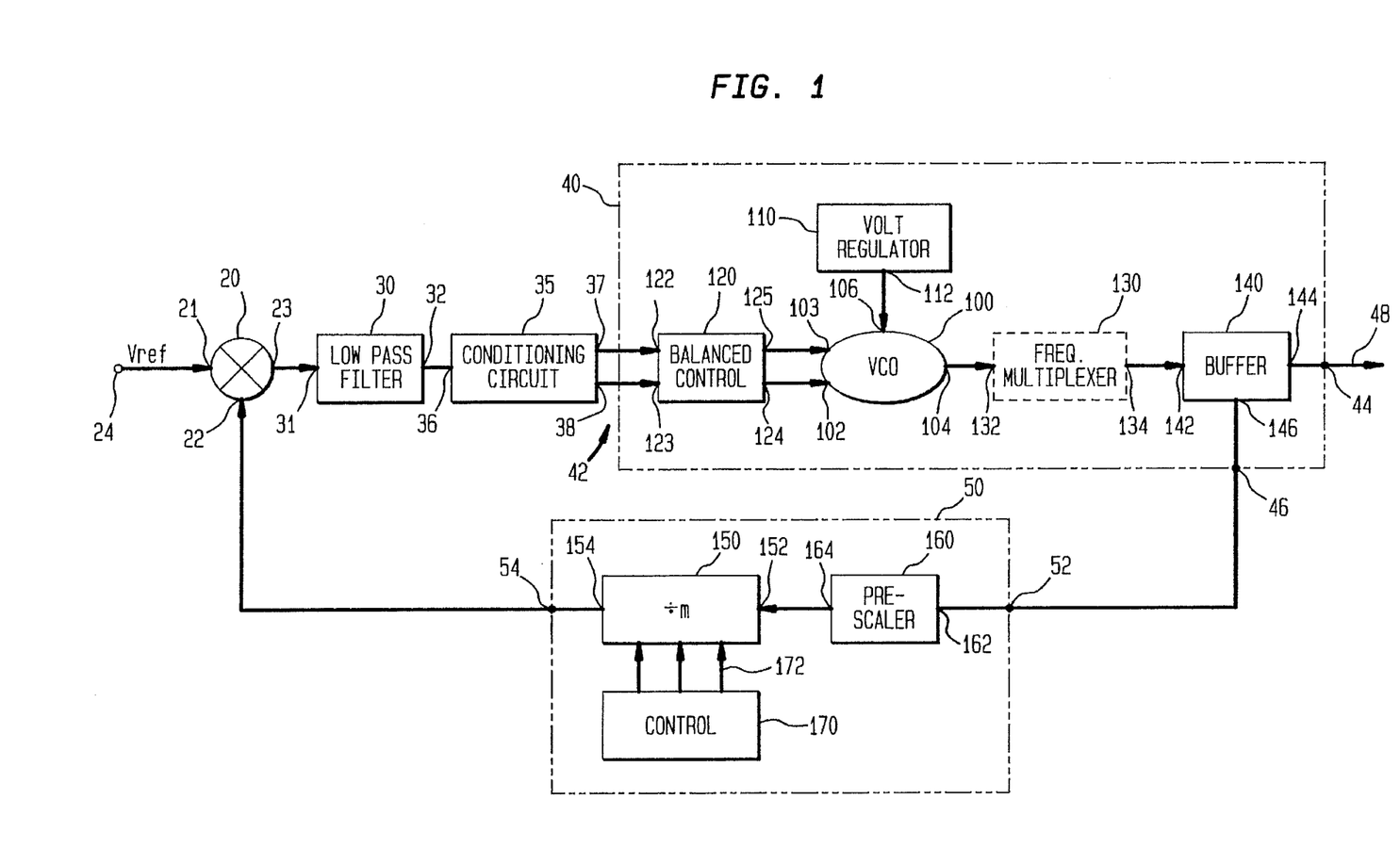
FIG. 1 is a schematic diagram of a preferred embodiment of the present invention in a phase-locked loop circuit configuration.

Referring to the figures in which like numerals refer to like portions thereof, FIG. 1 shows a block diagram of a phase-locked loop (PLL) circuit in accordance with a preferred embodiment of the present invention. The PLL circuit, generally designated as 10, comprises a phase detector 20, a low pass filter 30, conditioning circuit 35, a voltage control oscillator (VCO) module 40, a digital interface circuit 50.

Phase detector 20 includes a first input 21, a second input 22 and an output 23. First input 21 of phase detector 20 is configured to accept a reference signal having a reference frequency provided at reference port 24. Phase detector 20 is operative to compare two input signals and generate a phase detector output signal that is a measure of phase difference or difference in frequency between the input signals. For example, if the input signals differ in frequency, the phase detector will generate a periodic output at the difference frequency between the input signals. Phase detector 20 is a conventional phase detector such as a 565, 4044 or 4046 phase detector.

Output 23 of phase detector 20 is connected to input 31 of low pass filter 30, which serves to eliminate unwanted noise and high frequency components generated by phase detector 20 allowing only the required frequencies to pass to VCO module 40 without distortion. After the phase detector output signal is filtered by low pass filter 30, it is provided to low pass filter output to conditioning circuit 35. Conditioning circuit 35 includes an input 36, connected to output 32 of low pass filter 30, and outputs 37 and 38. Conditioning circuit is operative to supply output signals on outputs 37 and 38 having opposite polarities.

VCO module 40 includes a voltage controlled oscillator (VCO) 100, a voltage regulator 110, a balanced control input circuit 120, an optional frequency multiplier 130 (shown in phantom) and a buffer circuit 140.

VCO 100 includes control inputs 102 and 103 for applying control signals to the VCO, and an output 104 for providing an output signal having a frequency which varies in response to the control signal applied to control input 102. VCO 100 also includes a voltage supply input 106 for providing a supply voltage signal to power VCO 100. VCO 100, which generally includes a conventional active device, such as a BFR93A bipolar transistor or a U310 field-effect transistor (FET), and a resonant tank circuit. The resonant tank circuit can be formed in a number of different embodiments, including a variable capacitor combined with an inductor, a ceramic resonator, a dielectric resonator or a saw resonator. The tank circuit is operative to provide an output signal whose frequency is determined by the applied control signals supplied to control inputs 102 and 103. For example, for a substantially linear VCO, a control input voltage of a range from 0 to 10 volts might produce an output signal having a range from 1000 to 2000 MHz. Thus, VCO 100 in a PLL circuit is considered to be a frequency synthesizer because it generates or synthesizes an output signal at a frequency set by the control input voltage, generated based on the controller settings.

To provide power to VCO 100, voltage regulator 110 is preferably used. Voltage regulator 110, preferably a conventional LM328 or a CA3085 voltage regulator, includes an output 112 which is connected to supply input 106 of the VCO 100. Use of voltage regulator 110 provides advantages not achieved by powering a VCO directly with the available DC supply voltage, which is typically how the VCO is powered in a PLL circuit. By lowering the supply voltage provided to VCO 100 with voltage regulator 110, spurious response of the VCO output signal is greatly reduced. Preferably, voltage regulator 110 lowers the VCO supply voltage which typically fluctuates between 4.5 and 5.5 volts, down to 3 volts. The regulated 3 volt signal is advantageous because it provides a cleaner supply voltage to VCO 100 to reduce spurious response of the VCO which is highly sensitive to fluctuations in supply voltage. Preferably, voltage regulator 110 is integrated on VCO module 40, which provides additional benefits including noise reduction by shortening the length of the conductor carrying the voltage regulator output signal to VCO 100.

Figure 3:
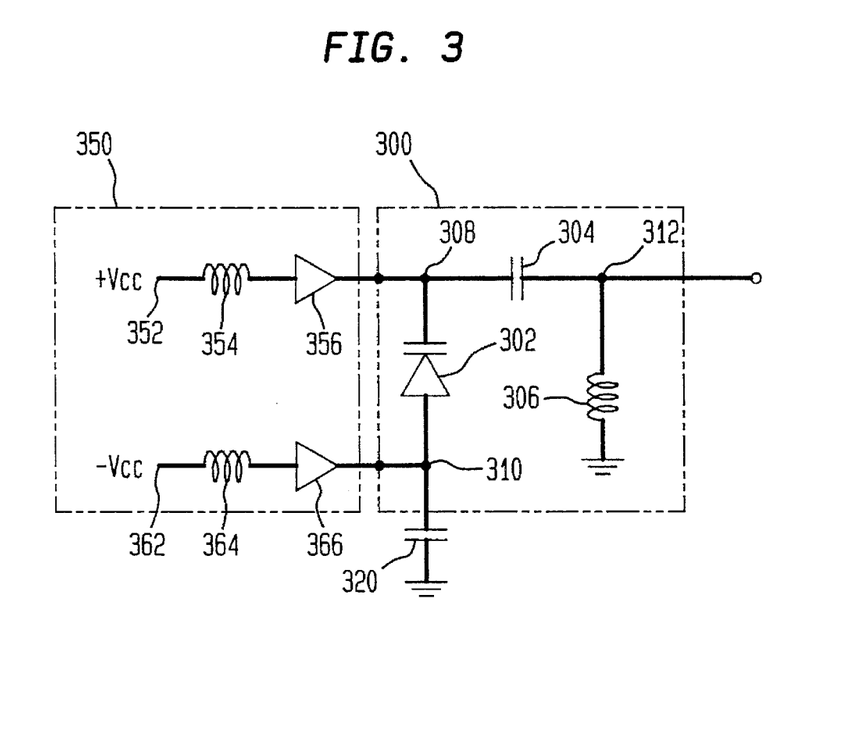
FIG. 3 is a schematic diagram of a voltage controlled oscillator with balanced control input in accordance with a preferred embodiment of the present invention.

Balanced control input circuit 120 includes inputs 122 and 123 and outputs 124 and 125. Inputs 122 and 123 are connected to outputs 37 and 38 of conditioning circuit 35, and outputs 124 and 125 are connected to inputs 102 and 103 of VCO 100. A preferred embodiment of balanced control input circuit 120 is illustrated in FIG. 3, which shows an oscillator circuit 300 and an input circuit 350. Oscillator circuit 300, which forms the LC tank circuit of a conventional VCO, includes variable capacitor or varactor 302, coupling capacitor 304, and coil 306. Varactor 302 is connected to oscillator circuit 300 at nodes 308 and 310, coupling capacitor is connected between nodes 308 and 312, and coil 306 is connected between node 312 and ground. Node 310 is connected to ground through RF capacitor 320, which serves to ground on the RF signal.

Input circuit 350 includes a first input 352 adapted for receiving a first input signal Vcc. First input 352 is connected to a choke 354, which is in turn connected to the input of a buffer amplifier 356, provided for buffering and, if possible, adjustable gain. The output of buffer amplifier 354 is connected to oscillating circuit 300 at node 308. Likewise, input circuit 350 also includes a second input 362 adapted for receiving a second input signal −Vcc. First input 352 is connected to a choke 364, which is in turn connected to the input of a buffer amplifier 366. The output of buffer amplifier 364 is connected to oscillating circuit 300 at node 310. Accordingly, the application of input signals having opposite polarities to first and second inputs 352 and 352 serves to bias varactor 302 and allows for common mode rejection (CMR); namely, the cancelling of noise which is common to the varactor terminals which are connected to nodes 308 and 310.

As shown in FIG. 1, frequency multiplier 130 includes an input 132 and an output 134. Input 132 is connected to output 104 of VCO 100 and output 134 is connected to the input of buffer circuit 140. Frequency multiplier is preferably a conventional frequency multiplier, such as a frequency doubler, tripler or quadrupler, such as part nos. XP, SMX and SLX series sold by Synergy Microwave Corp. of Paterson, N.J. A single frequency multiplier 130 can be chosen, or a number of multipliers can be cascaded together, to multiply the frequency of the VCO output signal by n, where n is an integer. The use of a frequency multiplier to increase the output frequency of the VCO is desirable, since it is generally expensive to use a VCO that is capable of generating very high frequencies which are typically needed at the GHz range for today's wireless communications. Preferably, frequency multiplier 130 is integrated on VCO module 40 to reduce size and to reduce noise by decreasing interconnection lengths between the VCO and the frequency multiplier.

Buffer circuit 140, which is integrated on VCO module 40, includes an input 142 connected to output 104 of VCO 100 (preferably through frequency multiplier 130) and two outputs 144 and 146. Buffer circuit 140 is adapted to conduct the VCO output signal from VCO 100 to output 144 and 146 to isolate external signals applied at output 144 ok buffer circuit 140. Various preferred embodiments of buffer circuit 140 are shown in FIGS. 2A–2F. Thus, turning to FIG. 2A, a PLL circuit 10a is shown in which comprises a phase detector 20a, a low-pass filter 30a, a VCO module 40a and a divide-by-n circuit 170a, which combines a prescaler, divide-by-m counter and digital controller. VCO module 40a includes a VCO 100a and a buffer circuit 140a, which is configured as an in-phase power divider 140a. Both VCO 100a and in-phase power divider 140a are integrated on VCO module 40a. In-phase power divider 140a includes an input port 142a and output ports 144a and 146a. Power divider 140a, which can be a passive or an active power divider, and is a conventional power divider, such as passive power dividers of the DSP, SPD or SDL series sold by Synergy Microwave Corp. Power divider 140a can be chosen to match the impedance on input port 142a and output ports 144a and 146a for any known load.

Figures 2A, 2B, 2C, 2D, 2E, 2F:
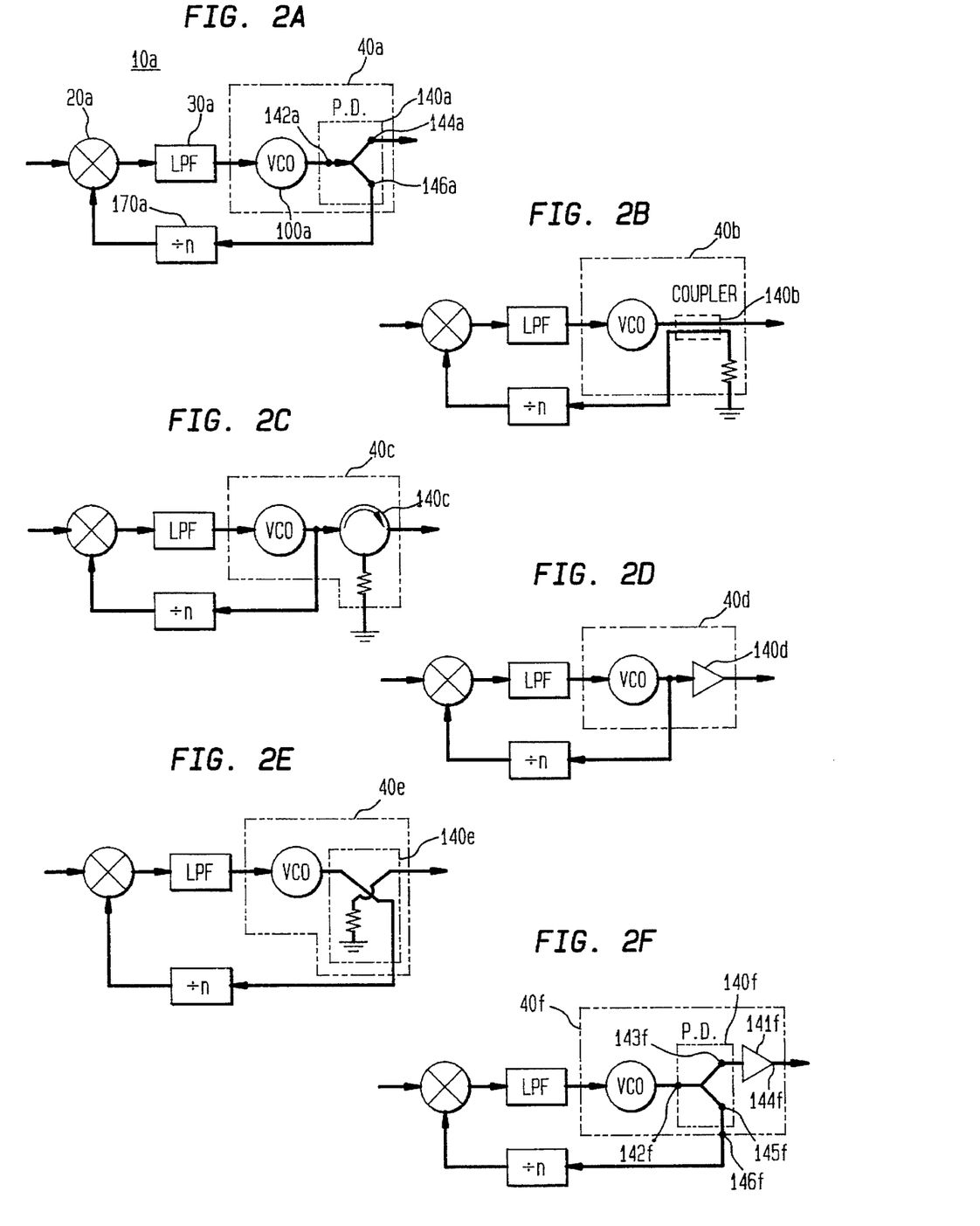
FIG. 2A is a schematic diagram of a phase-locked loop circuit with buffering in accordance with a preferred embodiment of the present invention.
FIG. 2B is a schematic diagram of a phase-locked loop circuit with buffering in accordance with another preferred embodiment of the present invention.
FIG. 2C is a schematic diagram of a phase-locked loop circuit with buffering in accordance with yet another preferred embodiment of the present invention.
FIG. 2D is a schematic diagram of a phase-locked loop circuit with buffering in accordance with a further preferred embodiment of the present invention.
FIG. 2E is a schematic diagram of a phase-locked loop circuit with buffering in accordance with yet another preferred embodiment of the present invention.
FIG. 2F is a schematic diagram of a phase-locked loop circuit with buffering in accordance with still another preferred embodiment of the present invention.

FIG. 2B shows the buffer circuit configured as a coupler 140b, which is integrated with VCO module 40b. Coupler 140b is a conventional coupler such as couplers of the KBP, SDC and SCL series sold by Synergy Microwave Corp. FIG. 2C shows the buffer circuit configured as an isolator 140c, which is integrated with VCO module 40c. Isolator 140c is a conventional isolator. FIG. 2D shows the buffer circuit configured as a high frequency amplifier 140d which is integrated with VCO module 40d. Amplifier 140d is a conventional high frequency amplifier such amplifiers of the SBA and SAMP series sold by Synergy Microwave Corp. FIG. 2E shows the buffer circuit configured as a hybrid 140e, which is integrated with VCO module 40e. Hybrid 140e can be either a 90 degree hybrid such as DQP, SMQ, SLQ series or a 180 degree hybrid such as DIP, SMJ or SLJ series sold by Synergy Microwave Corp.

Finally, FIG. 2F shows the buffer circuit configured as a combination of a power divider 140f and a high frequency amplifier 141f. It should readily be appreciated that the high frequency amplifier can likewise be combined with coupler 140b, isolator 140c or hybrid 140e to provide additional buffering.

Integration of buffer circuit 140 on VCO module 40 provides a number of benefits over providing buffering external to the VCO module. For example, the reduced length of the interconnection between the VCO and the buffering device improve the impedance matching, especially at high frequencies, and therefore reduces unwanted signals which are reflected back into the VCO. Integration of buffer circuit 140 on VCO module 40 also drastically reduces the modulation of the VCO output and improves spectral purity. Moreover, the integration of buffer circuit 140 results in a size reduction of the PLL circuit and overall savings in cost.

The isolation that can be achieved by the buffering depends on the components chosen for buffering circuit 140. For example, referring to FIG. 2e, in-phase power divider 140e provides a 3 dB isolation between input 142e and output ports 143e and 145e, while achieving about 20 dB or more isolation between output ports 143e and 145e. High frequency amplifier 141e provides about 40 dB isolation between its input 143e and output 144e. Thus from output 144e to output 146e of VCO module 40e, an isolation of over 60 dB is easily achieved.

Digital interface circuit 50 comprises a prescaler 160, a divide-by-m programmable divider 150 and a digital controller 170. Digital interface circuit includes an input 52 connected to the output 46 of VCO module 40, and an output 54 connected to input 22 of phase detector 20. Prescaler 160, which is a conventional prescaler such as part no. UPG501 from NEC, is operative to reduce, by a factor of x, the frequency of the feedback signal supplied to divide-by-m counter 150, such that n=m*x. Prescaler 160 includes an input 162, connected to output 46 of VCO module 40, and an output 164. Prescaler 160 is needed in PLL circuit 10 when the frequency of the output signal from VCO module 40 is too high for digital interface circuit 50 to process. Divided-by-m programmable divider 150 includes an input 152 and output 154. Input 152 of divide-by-m programmable divider 150 is connected to output 164 of prescaler 160 and output 154 of divide-by-m programmable divider 150 is connected to input 22 of phase detector 20. Digital interface circuit 50 also includes digital controller 170, which is connected to divide-by-m programmable divider through interface 172 and programmable to control the PLL circuit to lock to the desired frequency. Preferably, digital interface circuit 50 comprises state-of-the-art fractional-n synthesizers such as SA7025 and SA8025 synthesizers from Philips Semiconductors of California, USA, which incorporate the digital controller, pre-scaler, divide-by-m programmable divider and even the phase detector on a single chip.

Preferably, VCO module 40 which comprises VCO 100, voltage regulator 110, balanced control input circuit 120, optional frequency multiplier 130 and buffer circuit 140, all integrated on a single VCO chip, having preferred dimensions of about 0.5" by 0.5" by 0.25" (l×w×h), which is in turn integrated on a PLL module, such as the SPM series PLL module sold by Synergy Microwave, having preferred dimensions of about 0.75" by 0.75" by 0.4" (l×w×h). As discussed above in the context of the integration of VCO module 40, integration of the PLL components on a single PLL chip provides a number of advantages, including reduced size and cost savings, reduced interconnection lengths and improved impedance matching.

Figure 4:
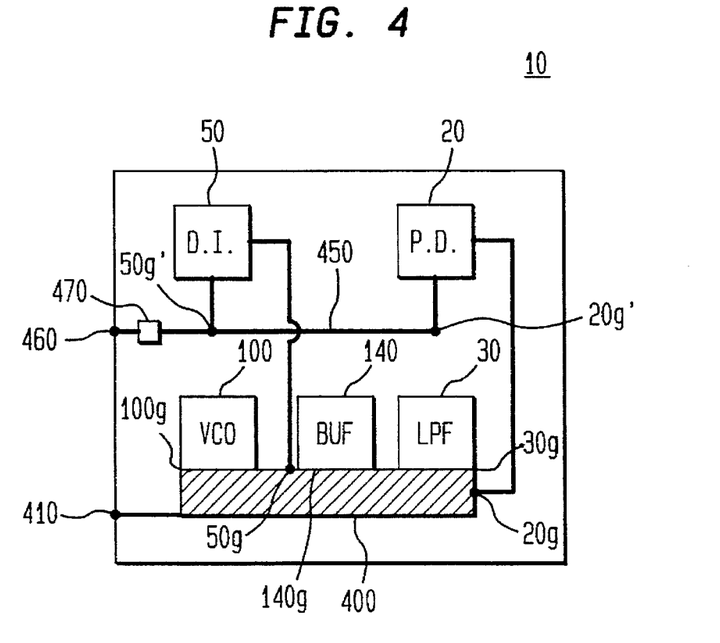
FIG. 4 is a schematic diagram of a phase-locked loop circuit with separate analog and digital grounds in accordance with a preferred embodiment of the present invention.

Referring now to FIG. 4, a schematic of a phase-locked loop (PLL) module is shown generally as 10. FIG. 4, not drawn to scale, illustrates the separate grounding aspect of the present invention. PLL module 10 includes analog or RF components such as VCO 100, buffering circuit 140 and low pass filter circuit 30, and combined analog/digital components such as phase detector 20 and digital interface circuit 50. VCO 100, buffering circuit 140 and low pass filter circuit 30 each include analog ground ports 100g, 140g and 30g respectively. Digital interface circuit 50 includes both an analog ground 50g and a digital ground port 50g'. Phase detector 20 also includes both an analog ground port 20g and a digital ground port 20g'. Besides these components, other analog, digital and combined analog/digital components with corresponding grounds can be provided on PLL 10. PLL module 10 further includes a common analog ground 400 having an analog ground port 410 and a common digital ground 450 having a digital ground port 460. Common analog ground 400 and common digital ground 450 are separately provided and spaced apart from one another on PLL module 10.

Accordingly, analog ground ports 100g of VCO 100, 140g of buffering circuit 140, 30g of low pass filter circuit 30, 50g of digital interface circuit 50 and 20g of phase detector 20 are each connected to common analog ground 400. Likewise, digital grounds 50g' of digital interface circuit 50 and 20g' of phase detector 20 are each connected to common digital ground 450. Preferably, common digital ground 450 is configured to carry ground signals up to about 10 MHz, and includes a low pass filter 470 connected thereto in order to filter out unwanted high frequencies on common digital ground 450.

Although the invention herein has been described with reference to particular embodiments it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A voltage controlled oscillator comprising:

(a) an oscillating circuit having two control inputs and means for outputting an oscillator output signal, said oscillating circuit being adapted to generate said oscillator output signal at a frequency dependent on a difference between voltages applied to said control inputs; and (b) an input control circuit comprising first input means for providing a first control input signal of a first polarity to one of said two control inputs and second input means for providing a second control input signal of a second polarity opposite to said first polarity to the other one of said two control inputs.

2. A voltage controlled oscillator circuit as claimed in claim 1, wherein said input control circuit comprises (a) a first input buffer circuit having a first input for receiving a first control voltage and a first output connected to one said control input of said oscillating circuit, said first input buffer circuit including a buffer amplifier and an inductor connected between said first input and said first output, and (b) a second input buffer circuit having a second input for receiving a second control voltage and a second output connected to the other said control input of said oscillating circuit, said second input buffer circuit including a buffer amplifier and an inductor connected between said second input and said second output.

3. A voltage controlled oscillator circuit as claimed in claim 1, wherein said voltage controlled oscillator and said input control circuit are provided on an integrated VCO module.

4. A voltage controlled oscillator circuit comprising:
(a) a voltage controlled oscillator having a control input for applying a control signal to said oscillator and an output for providing an output signal having an output frequency varying in response to the applied control signal;
(b) a buffering circuit having an input connected to the output of said oscillator, a first and second output, said buffer circuit being adapted to conduct the output signal from said oscillator to said first and second outputs and to isolate said first output from external signals applied to said second output, said oscillator and said buffer circuit being provided on an integrated VCO module, and wherein said buffering circuit includes a power divider.

5. A voltage controlled oscillator circuit as claimed in claim 4, wherein said power divider comprises a passive power divider.

6. A voltage controlled oscillator circuit as claimed in claim 4, wherein said power divider comprises a active power divider.

7. A voltage controlled oscillator circuit as claimed in claim 4, wherein said buffering circuit further includes a high frequency amplifier.

8. A voltage controlled oscillator circuit comprising:
(a) a voltage controlled oscillator having a control input for applying a control signal to said oscillator and an output for providing an output signal having an output frequency varying in response to the applied control signal;
(b) a buffering circuit having an input connected to the output of said oscillator, a first and second output, said buffer circuit being adapted to conduct the output signal from said oscillator to said first and second outputs and to isolate said first output from external signals applied to said second output, said oscillator and said buffer circuit being provided on an integrated VCO module, and wherein said buffering circuit includes a hybrid.

9. A voltage controlled oscillator circuit as claimed in claim 8, wherein said hybrid is a 90 degree hybrid.

10. A voltage controlled oscillator circuit as claimed in claim 8, wherein said hybrid is a 180 degree hybrid.

11. A voltage controlled oscillator circuit as claimed in claim 8, wherein said buffering circuit further includes a high frequency amplifier.

12. A phase-locked loop circuit comprising:
(a) a phase detector having a first input for receiving a reference signal, a second input for receiving a comparison signal, and an output for providing a control signal having a control frequency;
(b) a voltage controlled oscillator having a control input connected to said output of said phase detector for applying said control signal to said oscillator and an output for providing an output signal having an output frequency varying in response to the applied control signal;
(c) a buffering circuit having an input connected to the output of said oscillator, a first and second output, said buffer circuit being adapted to conduct the output signal from said oscillator to said first and second outputs and to isolate said first output from external signals applied to said second output, said buffer circuit and said oscillator being provided on an integrated VCO module; and
(d) a digital interface circuit having an input connected to said second output of said buffer circuit and an output connected to said second input of said phase detector for providing an output signal having a comparison frequency to said phase detector for comparison with the reference signal to generate said control signal, wherein said buffering circuit comprises a power-divider.

13. A phase-locked loop circuit as claimed in claim 12, wherein said power divider comprises a passive power divider.

14. A phase-locked loop circuit as claimed in claim 12, wherein said power divider comprises an active power divider.

15. A phase-locked loop circuit as claimed in claim 12, wherein said buffering circuit further includes a high frequency amplifier.

16. A phase-locked loop circuit comprising:
(a) a phase detector having a first input for receiving a reference signal, a second input for receiving a comparison signal, and an output for providing a control signal having a control frequency;
(b) a voltage controlled oscillator having a control input connected to said output of said phase detector for applying said control signal to said oscillator and output for providing an output signal having an output frequency varying in response to the applied control signal;
(c) a buffering circuit having an input connected to the output of said oscillator, a first and second output, said buffer circuit being adapted to conduct the output signal from said oscillator to said first and second outputs and to isolate said first output from external signals applied to said second output, said buffer circuit and said oscillator being provided on an integrated VCO module; and
(d) a digital interface circuit having an input connected to said second output of said buffer circuit and an output connected to said second input of said phase detector for comparison frequency to said phase detector for comparison with the reference signal to generate said control signal, wherein said buffering circuit includes a hybrid.

17. A phase-locked loop circuit as claimed in claim 16, wherein said buffering circuit further includes a high frequency amplifier.

18. A phase-locked loop circuit comprising:
(a) a phase detector having a first input for receiving a reference signal, a second input for receiving a comparison signal, an output for providing a control signal having a control frequency, an analog ground and a digital ground;
(b) a voltage controlled oscillator having a control input connected to said output of said phase detector for applying said control signal to said oscillator, an output for providing an output signal having an output frequency varying in response to the applied control signal, and an analog ground;
(c) a digital interface circuit having an input connected to said output of said oscillator, an output connected to said second input of said phase detector for providing an output signal having a comparison frequency to said phase detector for comparison with the reference signal to generate said control signal, an analog ground and a digital ground; and
(d) grounding means for connecting each said analog ground of the phase-locked loop circuit to a common analog ground and each said digital ground of the phase-locked loop circuit to a common digital ground separate from said common analog ground.

19. A phase-locked loop circuit as claimed in claim 18, further comprising a buffer circuit having an input connected to the output of said oscillator, a first output, a second output connected to said input of said control circuit, said buffer circuit being adapted to conduct the output signal from said oscillator to said first and second outputs and to isolate said first output from external signals applied to said second output, and an analog ground connected to said common analog ground.

20. A phase-locked loop circuit as claimed in claim 19, further comprising a low pass filter circuit connected between said output of said phase detector and said input of said oscillator, said low pass filter comprising an analog ground connected to said common analog ground.

21. A phase-locked loop circuit comprising:
(a) a phase detector having a first input for receiving a reference signal, a second input for receiving a comparison signal, an output for providing a primary control signal having a control frequency, an analog ground and a digital ground;
(b) a conditioning circuit having a first input connected to said output of said phase detector, a first output for providing a first control signal based on the primary control signal and a second output for providing a second control signal based on the primary control signal, said first and second control signals having opposite polarities;
(c) a voltage controlled oscillator having two control inputs connected to said first and second outputs of said conditioning circuit, an input control circuit for applying the first and second control signals to said control inputs of said oscillator, a supply input for providing a supply voltage signal to said oscillator, an output for providing an output signal having an output frequency varying in response to the applied control signals, and an analog ground;
(d) a voltage regulator for providing a regulated voltage to said supply input to reduce spurious response of the output signal, said voltage controlled oscillator and said voltage regulator being provided on an integrated VCO module;
(e) frequency multiplication means for increasing the output frequency of the output signal;
(e) a buffer circuit having an input connected to the output of said oscillator, a first and second output, said buffer circuit being adapted to conduct the output signal from said oscillator to said first and second outputs and to isolate said first output from external signals applied to said second output, and an analog ground;
(g) a digital interface circuit having an input connected to said second output of said buffer circuit, an output connected to said second input of said phase detector for providing an output signal having a comparison frequency to said phase detector for comparison with the reference signal to generate said control signal, an analog ground and a digital ground; and
(h) grounding means for connecting each said analog ground of the phase-locked loop circuit to a common analog ground and each said digital ground of the phase-locked loop circuit to a common digital ground separate from said common analog ground.

22. A voltage controlled oscillator comprising:
(a) an oscillating circuit having two control inputs, said oscillating circuit being adapted to oscillate at a frequency dependent on a difference between voltages applied to said control inputs; and
(b) an input control circuit for applying control input signals of opposite, polarity to said control inputs, said input control circuit comprising
(i) a first input buffer circuit having a first input for receiving a first control voltage and a first output connected to one said control input of said oscillating circuit, said first input buffer circuit including a buffer amplifier and an inductor connected between said first input and said first output, and
(ii) a second input buffer circuit having a second input for receiving a second control voltage and a second output connected to the other said control input of said oscillating circuit, said second input buffer circuit including a buffer amplifier and an inductor connected between said second input and said second output.

* * * * *

UNITED STATES PATENT AND TRADEMARK OFFICE
CERTIFICATE OF CORRECTION

PATENT NO. : 5,650,754
DATED : July 22, 1997
INVENTOR(S) : Joshi et al.

It is certified that error appears in the above-identified patent and that said Letters Patent is hereby corrected as shown below:

On the cover page, in the first line of the title, "PHASE-LOCHED" should read --PHASE-LOCKED--.

On the cover page, under *Attorney, Agent, or Firm*, insert --Lerner, -- before "David,".

Column 1, line 1, "PHASE-LOCHED" should read --PHASE-LOCKED--.

Column 3, line 30, "an coupler" should read --a coupler--.

Column 3, line 58, "taking" should read --taken--.

Column 5, line 63, "352 and 352" should read --352 and 362--.

Column 6, line 25, "ok" should read --of--.

Column 6, line 52, after "such" insert --as--.

Column 7, line 2, "improve" should read --improves--.

Column 9, line 20, "a active" should read --an active--.

Signed and Sealed this

Twenty-first Day of October 1997

*Attest:*

BRUCE LEHMAN

*Attesting Officer*        *Commissioner of Patents and Trademarks*